US006445009B1

(12) United States Patent
Grandjean et al.

(10) Patent No.: US 6,445,009 B1
(45) Date of Patent: Sep. 3, 2002

(54) STACKING OF GAN OR GAINN QUANTUM DOTS ON A SILICON SUBSTRATE, THEIR PREPARATION PROCEDURE ELECTROLUMINESCENT DEVICE AND LIGHTING DEVICE COMPRISING THESE STACKINGS

(75) Inventors: Nicolas Pierre Grandjean, Nice; Jean Massies, Valbonne; Benjamin Gérard Pierre Damilano, Mougins; Fabrice Semond, Mougins le Haut; Mathieu Leroux, Grasse, all of (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 09/634,654

(22) Filed: Aug. 8, 2000

(51) Int. Cl.$^7$ ................................................ H01L 27/15
(52) U.S. Cl. ............................. 257/85; 257/12; 257/13; 438/962
(58) Field of Search ............................. 257/12, 13, 14, 257/15, 18, 85; 438/962

(56) References Cited

U.S. PATENT DOCUMENTS

| | | | | |
|---|---|---|---|---|
| 5,075,742 A | | 12/1991 | Gerard et al. ................. | 257/96 |
| 6,153,894 A | * | 11/2000 | Udagawa ...................... | 257/96 |
| 6,242,764 B1 | * | 6/2001 | Ohba et al. ................... | 257/190 |
| 6,281,032 B1 | * | 8/2001 | Matsuda et al. .............. | 438/42 |
| 6,333,219 B1 | * | 1/2002 | Udagawa ...................... | 438/46 |

OTHER PUBLICATIONS

Micic et al., Synthesis, structure, and optical properties of collodial GaN quantum dots, Appl. Phys. Lett., 75 (Jul. 1999) 478.*
Damilano et al., GaN and GaInN quantum dots: an efficient way to get luminescence in the visible spectrum range, Appl. Surf. Sci., 164 (2000) 241.*
Krestnikov et al., Lasing in the Vertical Direction in InGaN/GaN/AlGaN Structures with InGaN Quantum Dots, Semiconductors, 34 (2000) 481.*
S. Nakamura, GaN–Based Blue/Green Semiconductor Laser, IEEE J. Selected Topics in Quantum Elec., 3 (1997) 435.*
Sakharov et al., Surface–mode lasing from stacked InGaN insertions in a GaN matrix, App. Phys. Lett., 74 (1999) 3921.*
Tachibana et al., Selective growth of InGaN quantum dot structures and their microphotoluminescence at room temperature, App. Phys. Lett., 76 (2000) 3212.*
B. Damilano, et al., Applied Physics Letters, vol. 75, No. 7, pps. 962–964, "From Visible to White Light Emission By GaN Quantum Dots on Si(111) Substrate," Aug. 16, 1999.
S. Guha, et al., Applied Physics Letters, vol. 72, No. 4, pps. 415–417, "Ultraviolet and Violet GaN Light Emitting Diodes on Silicon," Jan. 26, 1998.
R. Birkhahn, et al., Applied Physics Letters, vol. 74, No. 15, pps. 2161–2163, "Red Light Emission By Photoluminescence and Electroluminescence from Pr–Doped GaN on Si Substrates," Apr. 12, 1999.
J.M. Gérard, et al., Applied Physics Letters, vol. 68, No. 22, pps. 3123–3125, "InAs Quantum Boxes: Highly Efficient Radiative Traps For Light Emitting Devices on Si," May 27, 1996.

* cited by examiner

Primary Examiner—Richard Elms
Assistant Examiner—Christian D. Wilson
(74) Attorney, Agent, or Firm—Oblon, Spivak, McClelland, Maier & Neustadt, P.C.

(57) ABSTRACT

A device includes a silicon substrate provided with a coating including at least one stacking constituted by a plane of GaN or GaInN quantum dots emitting visible light at room temperature in a respective layer of AlN or GaN. The method of making the device is also disclosed. The device can be incorporated in electroluminescent devices and exchange devices, emitting white light in particular.

28 Claims, 2 Drawing Sheets

STACKING OF GAN OR GAINN QUANTUM DOTS ON A SILICON SUBSTRATE, THEIR PREPARATION PROCEDURE ELECTROLUMINESCENT DEVICE AND LIGHTING DEVICE COMPRISING THESE STACKINGS

BACKGROUND OF THE INVENTION

This invention relates to stackings of GaN or GaInN quantum dots on a silicon substrate.

More precisely, the invention concerns a silicon substrate provided with a coating comprising at least one stacking constituted by a layer of GaN or GaInN quantum dots emitting visible light at room temperature, in a layer of AlN or GaN respectively.

The invention also relates to the procedure for preparing such substrates, as well as the electroluminescent devices and the lighting devices comprising these substrates and stackings.

The technical domain of the invention can be defined as light production and, more precisely, that of white light production, the white light corresponding to the criteria laid down by the CIE in 1964, that is the coordinates in the chromatic diagram corresponding to x=0.33 and y=0.33, for perfect white light.

The production of white light is at present the subject of much research in order to perfect devices presenting in particular the properties of low cost, low energy consumption, a long lifetime and good energy efficiency.

In fact, for a long time white light has been essentially produced by incandescent lamps whose efficiency and lifetime are very low, since they are respectively about 5% and 1,000 hours. The efficiency of fluorescent tubes and their lifetime are higher, since they are about 25% and 1,000 hours for fluorescent lamps, but they present a certain number of drawbacks: in fact, they consist of vacuum tubes, complicated and costly to manufacture, and which, besides, contain several milligrams of highly toxic mercury, so that their destruction at the end of their lifetime poses a serious environmental problem.

In addition, fluorescent tubes produce a light which is not pleasant, which often limits their utilisation.

In terms of efficiency, the best industrial lamps at present are low pressure sodium lamps, which have an efficiency of about 35%. Just like the fluorescent tubes, these are lamps which are not very pleasant, or are even unacceptable for everyday lighting because of their colour. Research is thus directed towards other devices which are safe, solid, reliable, with a long lifetime, and able to produce white light at low cost with an energy efficiency higher than or equal to that of the devices mentioned above.

As an example, such sources of white light have been envisaged using, among others, phosphors, electroluminescent polymers and semiconductors.

Electroluminescent polymers, such as PPV, are very reasonably priced and the technology for using them, which just consists of inserting the polymer between semi-transparent electrodes, is very simple. The whole range of visible colours can be obtained and the emission of white light is obtained either through combination of the colours, or through using a single spectrum compound which is wide enough. However, these compounds are only used at present for the illumination of liquid crystal screens in orange light. The short lifetime of green and blue emitters of this type rule out production of white light with these electroluminescent polymers.

The production of white light by semiconductors depends essentially on nitrides and, in particular, nitrides of group III elements which, alone, emit green or blue with high efficiency and with a long lifetime. The most commonly used nitride type compound is GaInN which emits blue and red light.

A thin layer of nitrides, GaInN for example, inserted into a material such as Ga(Al)N and whose forbidden band fixes the emission wavelength and thus the colour, thus constitutes the elementary brick of the active zone of extremely bright Electroluminescent Diodes (LEDs).

The thickness of the layer of GaInN is generally lower than or equal to 100 Å and one then talks of LEDs with GaInN/Ga(Al)N quantum wells whose emission is centred on a particular colour, for example blue or green.

It is currently accepted that the composition in indium and/or the thickness of the layer of GaInN fixes the transition energy of the quantum well and, consequently, the wavelength of the LED emission. The GaInN/Ga(Al)N quantum wells, however, have very special optical properties for compositions in indium higher than 10%, among which one can mention the abnormally long radiative lifetime of the excitons and the very low energy variation of the forbidden band as a function of pressure.

The extremely bright blue LEDs, whose yield is already very high (greater than 10%), allows the production of white light through a hybrid technology, in which the blue LED serves for pumping the phosphors or polymers. The combination of the yellow luminescence of these compounds with that of the LED produces white light by colour addition. This technology is at present widely used by NICHIA®, as well as by HEWLETT-PACKARD®, GELCORE® or by SIEMENS-OSRAM® and its application to domestic lighting is very promising.

Nonetheless, the coupling of a LED and another constituent, such as phosphor or polymer, with the aim of obtaining white light is, because of its hybrid character, a costly and complex procedure, comprising several technological stages implying a posteriori, for example, the deposition on a blue LED of a phosphor or polymer type compound before encapsulation.

The balance of colours with a hybrid phosphor/polymer-LED is not simple and one does not easily obtain a white described as "pleasant" for domestic lighting. Besides, the device, unlike the procedure for its preparation, is complex, comprises numerous elements and is therefore less reliable than the basic nitride LED whose intrinsic lifetime is about 100,000 hours.

Finally, inherently, the yield of a hybrid system, in which losses are inevitable, is lower than that of the pumping nitride LED.

Therefore it would be interesting to have devices, in particular LED electroluminescent diodes emitting white light directly—that is to say monolithic devices—to be free from the inconveniences of hybrid devices implying coupling of a blue (or green) LED with a phosphor or polymer.

Moreover, in large-scale production of compounds comprising luminescent nitrides, the substrate used most often for growing nitrides is sapphire and, to a lesser extent, silicon carbide SiC. These two materials, particularly sapphire, have a certain number of inconveniences.

The inconveniences of sapphire are that it is an electric insulator and poor heat conductor, whereas the inconveniences of SiC are that it is expensive and of varying quality, and besides this, these two substrates have a limited size.

It was therefore envisaged to replace them by silicon which has evident advantages, both from the economical and technical points of view, compared with the two materials cited above.

In fact, apart from other interesting properties, silicon is a good heat conductor and can easily be eliminated by chemical means.

Moreover, since there already exists a technological channel for silicon which is perfectly controlled on the industrial scale, since its cost is very much lower than those of sapphire and SiC and since it is available under the form of very large-sized substrates, silicon is the substrate to choose for mass production at low cost.

There is therefore a real need to perfect electroluminescent devices on silicon substrates.

However, the growth of nitrides, such as gallium nitride, on silicon substrates come across problems due to the major differences existing between the mesh parameters and the coefficient of thermal expansion of the substrate and the nitride. In order to grow a nitride layer, such as GaN, of high quality, it is generally admitted that, beforehand, it is necessary to deposit on the silicon substrate a thin layer of, for example, AlAs, SiC or AlN, called a "buffer layer", of a thickness of several tens of nanometres.

The article by S. GUHA and N. A. BOJARCZUK, in Applied Physics Letters 72, 415 (1998) demonstrated that LEDs could be obtained by epitaxial growth through a molecular beam epitaxy procedure (MBE) on silicon (111). In the same way, the luminescence at room temperature of quantum wells (QWs) grown by MBE on silicon (111) was obtained. The integrated intensity remains weak.

However, nitrides which have grown on Si (111) present numerous and important defects and the non radiative carrier recombination channel limits the luminescence yield greatly.

An interesting approach for fabricating a material emitting visible light on Si, while avoiding the problems inherent to the presence of a high density of dislocations is that indicated by BIRKHAM, GARTER and STECKL in Appl. Phys. Lett. 74, 2161 (1999), which uses doping of GaN by rare earths. This procedure has the inconvenience that the operating voltages are high and that the "colour" is fixed by the element (no possibility of "tuning").

Another very interesting way of significantly reducing the degradation of internal quantum yield by non radiative recombination centres was proposed by J. M. GERARD, O. CABROL and B. SERMAGE in Appl. Phys. Lett. 68, 2123 (1996) and in the U.S. Pat. No. 5,075,742. This consists of putting quantum dots (QDs) into operation as an active medium: when they are captured by the QDs, the carriers occupy strongly localised states and their migration towards non-radiative recombination centres is hindered.

It is evident today that the quantum dots, for example InN, induced by phase separation in InGaN active layers are the basis of the high brightness of LEDs. On the other hand, fabrication of GaN quantum dots in AlGaN or AlN matrixes by MBE has been demonstrated on 6H—SiC or sapphire. Starting from such structures, blue-light emission has been observed. Quantum dots of gallium nitride on silicon with intense luminescence at room temperature have not yet been obtained.

Therefore, on the one hand, there exists a need for an electroluminescent device on a silicon substrate, emitting bright visible light at room temperature.

On the other hand, there exists a need, as mentioned above, for electroluminescent devices emitting white light directly, that is to say for monolithic devices.

SUMMARY OF THE INVENTION

The aim of the present invention is, amongst others, to respond to all these needs.

This aim, and further aims, are achieved according to the present invention by a silicon substrate provided with a coating comprising at least one stacking constituted by a plane or layer of quantum dots of GaN or GaInN emitting visible light at room temperature in a layer of AlN or GaN respectively.

Thanks to this coated Si substrate, it was possible in a surprising manner and for the first time to obtain intense luminescence with a radiative efficiency generally greater than 10% on a silicon substrate.

In the same way, in the invention, the luminescence yield is higher than that of prior art by several orders of magnitude.

Advantageously, according to the invention, the silicon substrate is a substrate in silicon (111).

Advantageously the layer of AlN or GaN is a relaxed or slightly strained layer of AlN or GaN.

Advantageously, according to the invention, it has been demonstrated that the emission wavelength of visible light from the layer of quantum dots was determined by the thickness of this layer of quantum dots. In other words, the emission energy can be tuned over the whole range corresponding to the emission colours of the light emitted for example in the GaN/AlN system, from blue to orange simply by controlling the size, that is the height of the quantum dots and the thickness of their layer. This is totally unexpected, referring back to prior art.

In fact, in the invention, it was pointed out that there existed a direct link between, on the one hand, the thickness of the layer or plane of QDs and their size or height. According to the invention, an intense photoluminescence is observed and, in function of the size of the quantum wells and thus the thickness deposited, one can vary the emitted wavelength determined specifically for visible light, bright, emitted at room temperature, over a whole range of emission wavelengths, for example from blue to orange.

Preferably, the plane or layer of quantum dots, for example of GaN, has a nominal thickness greater than three molecular monolayers, that is about 8 Å, in effect for a thickness greater than three molecular monolayers (ML), one obtains 3D coherent islands which are structures allowing the emission of visible light of a determined wavelength.

Advantageously, if the nominal thickness of the plane or the layer of quantum dots is from 4 to 12 MLs, by choosing a determined thickness in this range one will obtain an intense photoluminescence at room temperature with a perfectly determined emission wavelength.

The visible light emitted will, for example, have a violet colour for a thickness of 4 MLs, a blue colour for a thickness of 7 MLs, green for a thickness of 10 MLs and orange for a thickness of 12 MLs.

Advantageously, the silicon substrate can be provided with a coating comprising several stackings.

The number of stackings can, for example, be between 1 and 100.

If all the stackings comprise quantum dot planes of the same thickness, that is quantum dots of the same size and the same height, then all the quantum dot planes will emit light of the same wavelength and the light emitted by the coating as a whole will also be of the same wavelength, and the same colour as the light emitted by each of the layers and planes of the quantum dots. However, in this case, the intensity of the luminescence increases with the number of stackings.

Preferably, if the coating comprises several stackings, at least two of these stackings include quantum dot planes of different determined thickness each emitting visible light of determined wavelength different from the other plane of quantum dots.

Advantageously, when the coating comprises several stackings then each of the quantum dot planes of each of the stackings has a determined thickness different from the other planes, each of the quantum dot planes thus emitting visible light with a wavelength and colour determined, different from the wavelength emitted by the other planes.

The combination of light of different wavelengths, and thus of colours, determined and different, also provides visible light of a determined colour. Preferably this light is white light.

Thus, in choosing the thickness of each plane of quantum dots in an adequate manner, that is the size or essentially the height of these QDs, it is possible to obtain a coating on a silicon substrate which produces white light resulting from the combination of each light of different wavelengths emitted by each plane of quantum dots for each stacking.

According to the invention, for the first time it is possible to obtain white light with GaN quantum dots, in a monolithic fashion, by addition of different visible light of determined colours, emitted by the coating.

With a single substrate provided with the coating according to the invention, one obtains the emission of several colours, and not just a single colour, the combination of these colours providing, preferably, white light according the CIE criteria of 1964.

It is to be noted that with the substrate provided with the coating according to the invention, it is possible with several stackings to emit over the whole of the visible spectrum and in a continuous way.

If the combination of visible light emitted by each plane of quantum dots preferably provides white light, any light of a determined colour resulting from the combination of two or more determined colours of light can be obtained by the substrate provided with the coating according to the invention. These lights of determined and different colours, whose combination gives a new light of determined colour resulting from their combination are, preferably, the so-called primary colours: blue, green or red.

White can be obtained from two stackings only whose planes of quantum dots emit blue and yellow light respectively.

White can be obtained, for example, by superposition or juxtaposition of three stackings with quantum dot planes emitting blue, green and red light respectively.

White can also be obtained from a coating comprising the superposition of 4 stackings whose quantum dot planes have respectively a nominal thickness of 4, 6, 9 and 12 MLs which respectively emit visible light of the colours violet, blue, yellow and orange.

According to the invention the coating generally comprises in addition an upper layer of AlN of a thickness of 0.1 to 1 $\mu$m, preferably of a thickness of 0.3 $\mu$m.

The invention also relates to a preparation procedure, on a silicon substrate, of a coating comprising at least one stacking constituted by a plane or layer of quantum dots of GaN emitting visible light at room temperature in a layer respectively of AlN, in which the deposition of the plane of quantum dots is carried out at a temperature of 650 to 1,100° C. observing a growth interruption.

Thus, according to the invention, the deposition of the planes or layers of GaN quantum dots is not carried out in a continuous manner but in a sequential manner with a growth interruption, preferably at the end of the deposition of GaN (that is to say GaN forming quantum dots).

Advantageously, the deposition of the plane of GaN quantum dots is carried out at a temperature of 750° C. to 850° C., preferably close to 800° C.

Advantageously, the silicon substrate is a substrate in silicon (111).

Preferably, according to the invention, the layer of AlN is a relaxed or slightly strained layer.

Advantageously, the interruption lasts for a period of 1 to 30 seconds; preferably after the deposition of the planes of GaN dots.

Preferably, the growth interruption is performed after growing a GaN thickness greater than 3 MLs.

The nominal total thickness of the plane of GaN quantum dots is preferably between 4 MLs and 12 MLs.

Advantageously, growth is carried out by Molecular Beam Epitaxy (MBE) at a temperature of 650 to 950° C., preferably at a temperature of 750 to 850° C., and again preferably close to 800° C., in the presence of a precursor (or reagent) of gallium and a precursor of nitrogen.

Advantageously, the growth interruption will thus be carried out by suppressing both the precursor of gallium and the precursor (or reagent) of nitrogen and, preferably, besides this, by maintaining, during the growth interruption, the same temperature as that used during the deposition of GaN.

The precursor of nitrogen (or reagent) used is preferably ammonia $NH_3$.

The inventors have demonstrated that when GaN is deposited on AlN, relaxed or slightly strained for example at 800° C., by MBE, a 2D growth mode can be observed even for large thicknesses. However, the in-plane lattice parameter begins to change at about 12±1 Monolayers (MLs), that is to say at about 30 Å.

This behaviour is associated with the beginning of relaxation by misfit dislocation generation.

Because of this, it seemed totally impossible to form quantum dots, that is 3D islands at classic growth temperatures, for example about 800° C.

In fact, when the temperature of the substrate is lowered to the 500 to 600° C. range, a transition from a 2D growth mode to a 3D growth mode occurs after the growth of several monolayers, but then the quality of the GaN obtained at low growth temperatures is quite poor. Moreover, plastic relaxation starts after only 2 MLs probably due to the formation of structural defects.

Thus, GaN quantum dots of high quality could not be produced in the temperature range of 500 to 600° C. On the other hand, at temperatures higher than 600° C., a 2D growth mode was observed when GaN was deposited on AlN continuously.

In a surprising way, the inventors showed that by carrying out a growth interruption, during the deposition of the layer of GaN of the quantum dots plane, a morphological transition from 2D to 3D took place instantaneously precisely at the time of the growth interruption.

Advantageously, the growth interruption is carried out by suppressing not only the gallium precursor but also, simultaneously, the nitrogen precursor as well. It is precisely, and in a surprising manner, the fact of suppressing the gallium precursor and the nitrogen precursor which makes it possible to obtain not only a growth interruption but also, besides this, the unexpected 2D–3D morphology transition at the time of growth interruption.

In other words, the suppression of the Ga precursor alone ensures growth interruption, but without any 2D–3D transition being observed, but if one suppresses the other precursor at the same time, that is to say the nitrogen precursor (for example $NH_3$), one surprisingly observes the transition from 2D to 3D. It was not at all foreseeable that the fact of suppressing the two precursors (of Ga and of N) at the same time could provoke this transition.

This has been confirmed and demonstrated by measuring the RHEED Bragg spot intensity for a deposit of one layer of GaN of 5 MLs during growth interruption at 800° C. The strong Bragg intensity increase shows the 2D–3D transition which occurs instantaneously when growth interruption takes place, the RHEED pattern changing to spotty-like and no longer streaky-like.

The formation of 3D islands with (1013) facets is clearly shown by the RHEED pattern. For the first time, the procedure of the invention allows the growth of planes of GaN quantum dots of excellent quality at current deposition temperatures of 750 to 850° C., for example close to 800° C.

Besides, the inventors have demonstrated that in the case of GaN/AlN systems, the thickness of 3 MLs (about 8 Å) was the critical thickness for obtaining 3D coherent islands at the time of growth interruption.

The invention also relates to an electroluminescent device and a lighting device comprising at least one silicon substrate coated as defined above, this device preferably emitting white light.

Preferably, this device is a LED type device, which takes up the concept of quantum dots and addition of colours, developed in the present invention, applied in particular to the GaInN/GaN system.

BRIEF DESCRIPTION OF THE DRAWINGS

The invention will now be described below in detail in the following description given as an illustrative but non-restrictive example, in reference to the two accompanying drawings, in which.

Figure 1:
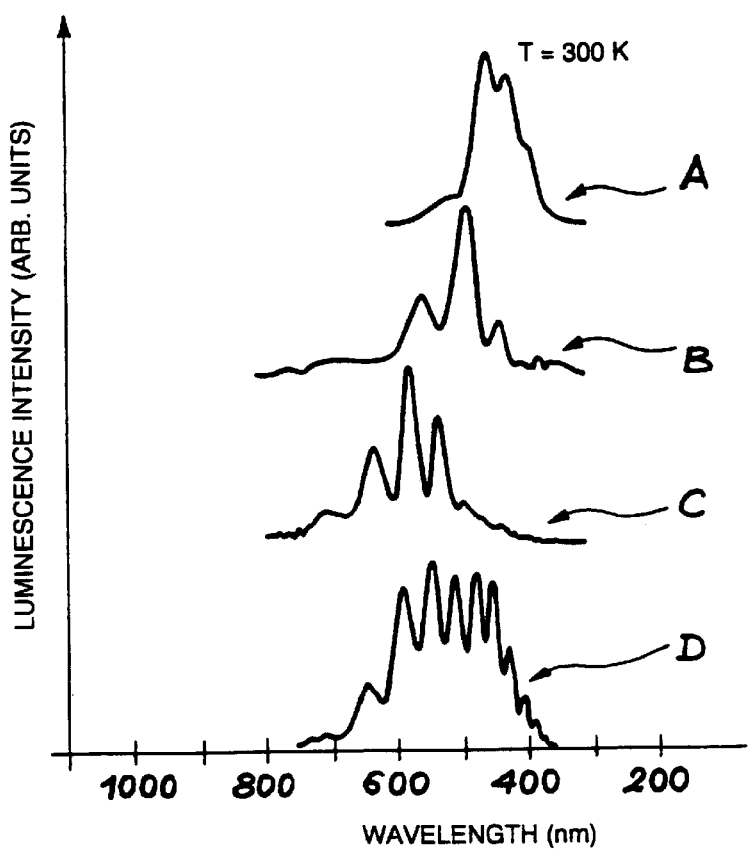
FIG. 1 is a graph showing the photoluminescence spectra at room temperature (T=300 K) of single planes of quantum dots emitting respectively blue light (A), green light (B) and orange light (C). These planes have been formed from 2D layers with respective thickness of 7, 10 and 12 MLs. The luminescent intensities are indicated by the ordinates (in arbitrary units) and the wavelengths (in nanometres) by the abscissae.
Figure 2:
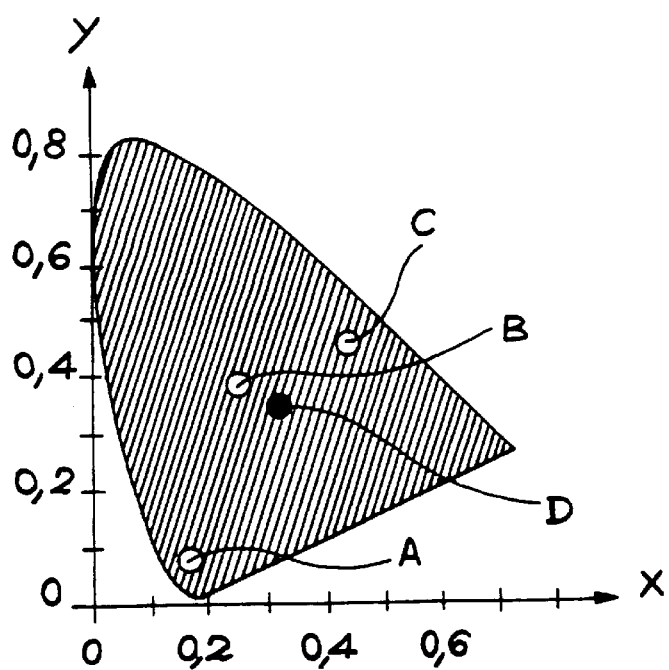

The spectrum (D) is the spectrum of a coating comprising the superposition of 4 planes of quantum dots of planes of quantum dots of adequate size, the combination of the light emitted by these 4 planes giving white light;

FIG. 2 is a chromaticity diagram (X, Y) according to the CIE criteria of 1964, on which the chromatic coordinates have been marked (points A, B, C, D), of the photoluminescence spectra (A, B, C, D) of FIG. 1.

The white circles correspond to the colour coordinates (A, B, C) of the light emitted by single layers of quantum dots, and the black circle corresponds to the coordinates of the colour of white light (D), the addition of the light emitted by 4 planes of superposed quantum dots.

Figure 3:
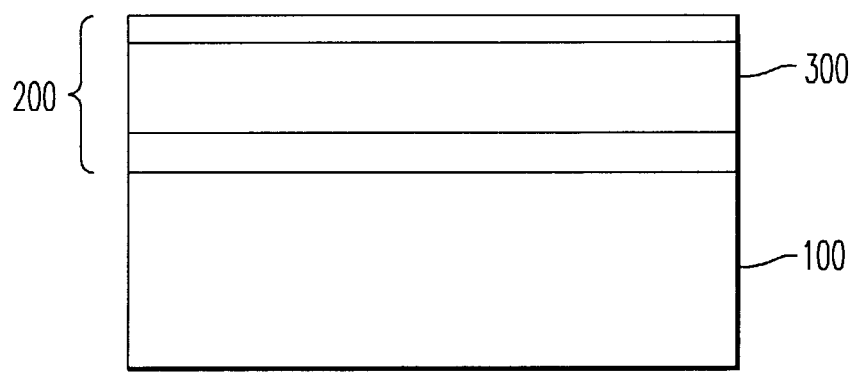
Figure 4:
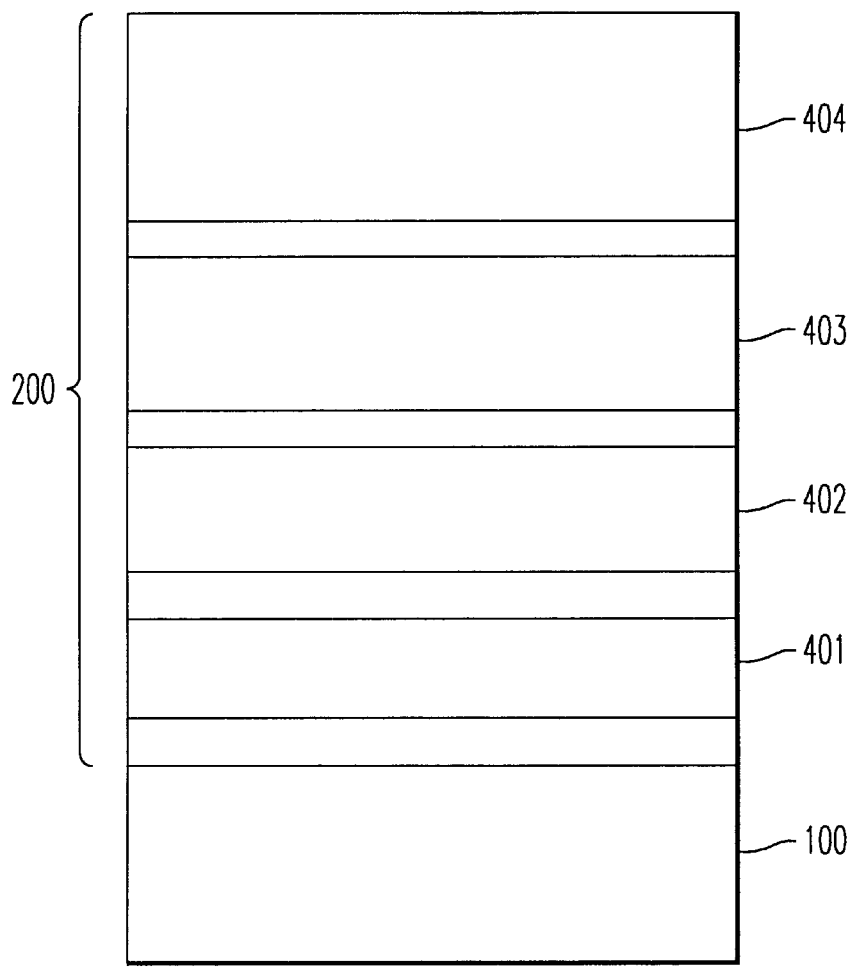

FIGS. 3–4 show schematic representations of the present invention according to two different embodiments.

DETAILED DESCRIPTION OF THE INVENTION

In the following, the invention is described more especially in reference to the GaN/AlN system.

It is evident that the invention could just as well be described for the GaInN/GaN system with a few adaptations which can easily be made by those skilled in the art.

The procedure of the invention in which layers of GaN and AlN are grown on silicon generally uses a Molecular Beam Epitaxy (MBE) deposition technique. The substrate is generally a substrate of Si (111). In the case where the MBE technique is used, the active nitrogen source is generally $NH_3$.

In a preceding stage, one generally proceeds with a stage of de-oxidisation of the Si substrate.

This de-oxidisation stage consists, for example, of a rapid thermal annealing at a temperature which often reaches, for example, 900° C. Preferably, the temperature is not lower than a certain threshold. The RHEED reflection high-energy electron diffraction in fact indicates the formation of a 7×7 surface reconstruction when the temperature falls below 830° C.

Next a so-called buffer layer of AlN is deposited on the silicon, generally at a temperature between 650 and 900° C., for example around 800° C. Then, the temperature is lowered further to grow a layer generally about 1 μm thick of "GaN template".

Next a layer of AlN is deposited, generally from 0.1 to 1 μm, for example a thickness of 0.3 μm, generally at a temperature of 800 to 1,000° C., for example at 900° C.

When the in-place lattice parameter variation is measured by RHEED as a function of growth time, it is noted that this AlN template is relaxed.

The formation of quantum dots of GaN on AlN can be obtained either by using Si as an anti-surfactant, or by a strain-induced 2D–3D transition, this latter method being preferred in the present invention.

As previously, the deposit of GaN is obtained by MBE. The relaxation mechanism produced during the GaN deposition on the completely relaxed AlN can be followed by RHEED.

According to the invention, in a totally surprising manner, it was noted that by growing layers of GaN planes and observing growth interruption, it was possible to obtain high quality planes of quantum dots with 3D coherent islands.

When growth was interrupted, there was an instantaneous 2D–3D transition, clearly evident from the RHEED diagram.

In the case of the GaN/AlN system, the critical thickness of 3 MLs was determined as allowing the formation of quantum dots, that is to say 3D coherent islands during growth interruption.

This point is fundamental, since it allows the production of quantum dots of different sizes and different heights just by changing the nominal thickness in the 4 to 12 MLs range, that is to say between on the one hand the appearance of the 2D–3D transition and, on the other, the appearance of plastic relaxation (through formation of dislocations).

Because of this, according to the invention, one begins by depositing a layer of the thickness chosen, for example a thickness greater than 3 MLs and up to 12 MLs of GaN on the AlN layer acting as substrate and then one carries out a growth interruption, that is to say that since one is using MBE as a growth method, one stops the supply of precursor or reagent, such as $NH_3$. Growth interruption thus takes place without reagent or precursor, such as $NH_3$.

This growth interruption is of a variable length of time but it generally lasts from 1 to 30 seconds, for example 10 seconds.

This growth interruption can possibly be accompanied by an increase in temperature. Nevertheless, preferably, during this growth interruption the same temperature is maintained as that present during the growth of the GaN layer.

Next an AlN layer is deposited, for example of a thickness of 100 to 500 Å, for example 300 Å on the summit of the layer of the plane of quantum dots.

The same process is repeated if the coating comprises several stackings of planes of quantum dots on the AlN layers, the last coating layer deposited being a layer of AlN of the thickness indicated above.

It has already been noted that the GaN/AlN quantum dots can produce luminescence at 2.95 eV. If one considers the forbidden bands (at room temperature or RT band gap) of AlN (6.2 eV) and GaN (3.6 eV when strained on AlN), this behaviour may appear surprising but it is simply the consequence of the strong built-in electric field which is present in the wurtzite nitride heterostructures.

It was experimentally determined as being able to reach 5 MV/cm in the GaN/AlN quantum dots. This means that a considerable redshift of the transition energy of the quantum dots is expected because of the quantum confined stark effect.

A difference of 1 ML in the GaN quantum dot height induces an energy shift of 130 meV. Since up to 12 MLs of GaN can be grown pseudomorphically and one can then transform them into 3D islands, one can thus obtain, according to the invention, visible light emission by a plane of quantum dots over the whole visible spectrum.

The invention will now be described in reference to the following examples given as illustrative but non-restrictive examples.

EXAMPLES

In the following examples 1 to 4, illustrated in FIGS. 3 and 4, the coatings 200 are prepared on a substrate 100 according to the invention conforming to the procedure of the invention. The coatings 200 of examples 1 to 3, shown in FIG. 3, include only a single plane 300 of quantum dots of determined thickness and thus emit a single light determined by the wavelength. The coating 200 of example 4, shown in FIG. 4, includes four (4) planes 401 to 404 of quantum dots, each having a different thickness.

The GaN quantum dots fabricated in examples 1 to 3 which follow have different sizes taking advantage of the 2D–3D transition induced by the growth interruption.

EXAMPLE 1

A silicon substrate (111) is submitted to rapid annealing at a temperature of up to 900° C. to eliminate the native oxygen on the silicon (111).

Next a buffer layer of AlN is deposited of a thickness of 300 Å at a temperature of 900° C. by molecular beam epitaxy (MBE) using $NH_3$ as a source of active nitrogen.

The temperature is then lowered to 800° C. for the growth of a layer of GaN template, of a thickness of about 1 µm by MBE with the same precursors. Next a layer of AlN is grown with a thickness of 0.3 µm at 900° C. By measuring the in-plane lattice parameter variation by reflection high-energy electron diffraction, one notes that this layer is relaxed.

The deposition of the plane of quantum dots is carried out by MBE at 800° C. under the following conditions: at 800° C. one deposits between 3 and 12 MLs (included) of GaN, then there is a growth interruption of 30 seconds allowing the formation of 3D islands (at constant growth temperature).

After growth interruption, a layer of AlN (300 Å) is deposited, again by MBE, under the same conditions as those described above on the quantum dots plane.

In this example, the single plane of quantum dots has a thickness of 7 MLs.

EXAMPLE 2

A coating is prepared in the same manner as in example 1, except for the fact that the single plane of quantum dots has a thickness of 10 MLs.

EXAMPLE 3

A coating is prepared in the same way as in example 1, except for the fact that the single plane of quantum dots has a thickness of 12 MLs.

Photoluminescence (PL) experiments are carried out at room temperature (RT) on coatings of examples 1 to 3, using the 244 nm line of a frequency-doubled $Ar^+$ laser (40 $W/cm^2$), (excitation source for luminescence). The photoluminescence at room temperature (T=300 K) is induced by the excitation of the quantum dot planes with the aid of a 10 mW "unfocused" HeCd laser of (0.3 $W/cm^2$)

The photoluminescence spectra of the planes of quantum dots in the examples 1, 2, 3 are given on FIG. 1 (spectra A, B, C respectively). It is thus possible to note that the planes of the quantum dots are efficient structures for emitting light from blue (spectrum A, example 1) to orange (spectrum C, example 3), passing via green (spectrum B, example 2).

In the same way, in FIG. 2, the chromatic coordinates (white circles) of the colours of light emitted by the planes of quantum dots of examples 1, 2, 3 are respectively x=0.16, y=0.10 (A); x=0.25, y=0.38 (B); and x=0.43, y=0.46 (C).

These results are confirmed by photographs of luminescence at room temperature induced by the HeCd laser.

EXAMPLE 4

The coating is prepared according to the invention by the invention procedure in a manner analogous to that of examples 1 to 3, except that, instead of depositing a single stacking of a plane of quantum dots of GaN on an AlN layer, 4 are deposited, with different thickness: that is 4, 6, 9 and 12 MLs. Each of the planes of quantum dots emits respectively a light of colour violet, blue, yellow and orange, and the combination of these lights gives white light.

On the summit of the coating, a layer of AlN of a thickness of 300 Å is deposited.

The luminescence spectrum is shown on FIG. 1 (D). Despite a slight deficit in red photons, the colour of the luminescence seems completely white to the eye.

This is confirmed by the chromatic coordinates according to the CIE criteria of 1964 (black circle on FIG. 2) for luminescence which are x=0.31 and y=0.35, that is to say very close to the coordinates for perfect white colour, x=0.33 and y=0.33.

What is claimed is:

1. A device comprising:
   a silicon substrate; and
   a coating provided on said substrate, said coating comprising at least one stacking including a plane of quantum dots of GaN or GaInN emitting visible light at ambient temperature in a layer of AlN or GaN respectively.

2. A device according to claim 1, wherein the silicon substrate is a substrate of silicon (111).

3. A device according to claim 2, wherein the layer of AlN or GaN is a relaxed or slightly strained AlN or GaN layer.

4. A device according to claim 2, wherein the emission wavelength of visible light of the plane of quantum dots is determined by the thickness of the plane of quantum dots.

5. A device according to claim 2, wherein the plane or layer of quantum dots of GaN has a nominal thickness greater than three molecular layers (MLs).

6. A device according to claim 5, wherein the plane of quantum dots has a nominal thickness of 4 to 12 molecular layers (MLs).

7. A device according to claim 2, wherein the coating comprises several stackings.

8. A device according to claim 1, wherein the layer of AlN or GaN is a relaxed or slightly strained AlN or GaN layer.

9. A device according to claim 8, wherein the emission wavelength of visible light of the plane of quantum dots is determined by the thickness of the plane of quantum dots.

10. A device according to claim 8, wherein the plane or layer of quantum dots of GaN has a nominal thickness greater than three molecular layers (MLs).

11. A device according to claim 10, wherein the plane of quantum dots has a nominal thickness of 4 to 12 molecular layers (MLs).

12. A device according to claim 8, wherein the coating comprises several stackings.

13. A device according to claim 1, wherein the emission wavelength of visible light of the plane of quantum dots is determined by the thickness of the plane of quantum dots.

14. A device according to claim 13, wherein the plane or layer of quantum dots of GaN has a nominal thickness greater than three molecular layers (MLs).

15. A device according to claim 14, wherein the plane of quantum dots has a nominal thickness of 4 to 12 molecular layers (MLs).

16. A device according to claim 13, wherein the coating comprises several stackings.

17. A device according to claim 1, wherein the plane or layer of quantum dots of GaN has a nominal thickness greater than three molecular layers (MLs).

18. A device according to claim 17, wherein the plane of quantum dots has a nominal thickness of 4 to 12 molecular layers (MLs).

19. A device according to claim 1, wherein the coating comprises several stackings.

20. A device according to claim 1, wherein at least two of the stackings comprise quantum dot planes of different determined thickness each emitting visible light of a determined wavelength, and colour, different from the other plane of the quantum dots.

21. A device according to claim 20, wherein each of the quantum dot planes of each of the stackings has a determined thickness, different from the others, each of the quantum dot planes thus emitting visible light of a wavelength, and a determined colour, different form the others.

22. A device according to claim 20, wherein the combination of visible light of determined and different wavelengths and colours produces white light.

23. A device according to claim 22, wherein the coating comprises the superposition of 4 stackings whose quantum dot planes have respectively a nominal thickness of 4,,6, 9 and 12 MLs.

24. An electroluminescent device comprising the device according to claim 1.

25. A device according to claim 24, emitting white light.

26. A lighting device comprising the device according to claim 1.

27. A device according to claim 26 emitting white light.

28. A device according to claim 1, which is a LED (electroluminescent diode).

* * * * *